(12) United States Patent
Fukuda

(10) Patent No.: US 7,105,998 B2
(45) Date of Patent: Sep. 12, 2006

(54) EL LIGHT EMITTING DEVICE WITH WATERPROOF FUNCTION

(75) Inventor: Shinsaku Fukuda, Komaki (JP)

(73) Assignee: Print Labo Co., Ltd., Kasugai (JP)

( * ) Notice: Subject to any disclaimer, the term of this patent is extended or adjusted under 35 U.S.C. 154(b) by 0 days.

(21) Appl. No.: 10/513,820

(22) PCT Filed: May 15, 2003

(86) PCT No.: PCT/JP03/06055

§ 371 (c)(1),
(2), (4) Date: Nov. 9, 2004

(87) PCT Pub. No.: WO03/098975

PCT Pub. Date: Nov. 27, 2003

(65) Prior Publication Data

US 2005/0152125 A1 Jul. 14, 2005

(30) Foreign Application Priority Data

May 17, 2002 (JP) ............................. 2002-143427
Feb. 7, 2003 (JP) ............................. 2003-030809

(51) Int. Cl.
*H05B 33/22* (2006.01)
*H05B 33/26* (2006.01)
(52) U.S. Cl. ........................ 313/500; 313/506
(58) Field of Classification Search ........ 313/500–506, 313/512; 315/169.3; 345/36, 45, 76
See application file for complete search history.

(56) References Cited

U.S. PATENT DOCUMENTS

| | | |
|---|---|---|
| 3,067,530 A | 12/1962 | Bolsey |
| 3,152,994 A | 10/1964 | Thornton, Jr. et al. |
| 3,290,537 A | 12/1966 | Logan |
| 3,443,332 A | 5/1969 | Christy |
| 3,641,533 A | 2/1972 | Sylvander |
| 3,740,616 A | 6/1973 | Suzuki et al. |
| 4,172,333 A | 10/1979 | Towsend |
| 4,345,249 A | 8/1982 | Togashi |
| 4,451,525 A * | 5/1984 | Kawazoe et al. ........... 428/213 |

(Continued)

FOREIGN PATENT DOCUMENTS

DE 3009235 A * 4/1982

(Continued)

OTHER PUBLICATIONS

International Preliminary Examination Report dated Feb. 5, 2004 issued in corresponding International Application No. PCT/JP2003/006055.

(Continued)

*Primary Examiner*—Christopher M. Raabe
(74) *Attorney, Agent, or Firm*—Staas & Halsey LLP

(57) ABSTRACT

An EL light emitting device has: an EL light emitting layer having an EL light emitting material element; and an electrode section having a first electrode and a second electrode which are arranged on one surface side of the EL light emitting layer to be electrically separated from each other with a spacing region, and having a predetermined pattern. An alternating current electric field forming element, to form an alternating current electric field in the EL light emitting layer when an alternating current power supply voltage is applied between the first electrode and the second electrode, is adhered to the other surface side of the EL light emitting layer. A waterproof layer of a synthetic resin is arranged between at least one of the first electrode and the second electrode, and the EL light emitting layer.

4 Claims, 8 Drawing Sheets

U.S. PATENT DOCUMENTS

| | | | |
|---|---|---|---|
| 4,517,490 A * | 5/1985 | Takahashi et al. ......... 313/502 |
| 4,590,381 A | 5/1986 | Mendelson |
| 4,686,110 A | 8/1987 | Endo et al. |
| 5,301,982 A | 4/1994 | Brotz |
| 5,319,491 A | 6/1994 | Selbrede |
| 5,351,143 A | 9/1994 | Sato et al. |
| 5,483,120 A | 1/1996 | Murakami |
| 5,551,905 A | 9/1996 | Billings et al. |
| 5,594,562 A | 1/1997 | Sato et al. |
| 5,597,183 A | 1/1997 | Johnson |
| 5,598,285 A | 1/1997 | Kondo et al. |
| 5,674,104 A | 10/1997 | Ohashi et al. |
| 5,677,546 A | 10/1997 | Yu |
| 5,680,160 A | 10/1997 | La Pointe |
| 5,737,051 A | 4/1998 | Kondo et al. |
| 5,793,158 A | 8/1998 | Wedding, Sr. |
| 5,852,509 A | 12/1998 | Coleman |
| 5,977,704 A | 11/1999 | Shi et al. |
| 5,990,629 A * | 11/1999 | Yamada et al. ......... 315/169.3 |
| 6,054,725 A | 4/2000 | Lindenbaum et al. |
| 6,084,007 A | 7/2000 | Narukawa et al. |
| 6,091,382 A | 7/2000 | Shioya et al. |
| 6,124,915 A | 9/2000 | Kondo et al. |
| 6,144,156 A | 11/2000 | Lutschounig et al. |
| 6,183,262 B1 | 2/2001 | Tseng |
| 6,205,690 B1 | 3/2001 | Heropoulos et al. |
| 6,271,626 B1 | 8/2001 | Ford et al. |
| 6,297,812 B1 | 10/2001 | Ohara et al. |
| 6,326,735 B1 | 12/2001 | Wang et al. |
| 6,341,004 B1 | 1/2002 | Kondo et al. |
| 6,348,908 B1 | 2/2002 | Richley et al. |
| 6,479,930 B1 | 11/2002 | Tanabe et al. |
| 6,580,214 B1 | 6/2003 | Yoneda et al. |
| 6,727,647 B1 | 4/2004 | Fukuda et al. |
| 6,747,415 B1 | 6/2004 | Moser |
| 2001/0018809 A1 | 9/2001 | Heropoulos et al. |
| 2002/0017857 A1 | 2/2002 | Hashimoto et al. |
| 2002/0036463 A1 | 3/2002 | Yoneda et al. |
| 2002/0180712 A1 | 12/2002 | Sato et al. |
| 2003/0193286 A1 | 10/2003 | Ottermann et al. |
| 2003/0197461 A1 | 10/2003 | Fukuda et al. |
| 2004/0000863 A1 | 1/2004 | Miyake |
| 2004/0041516 A1 * | 3/2004 | Watanabe et al. ......... 313/498 |

FOREIGN PATENT DOCUMENTS

| | | |
|---|---|---|
| EP | 1 164 621 | 12/2001 |
| GB | 735752 | 8/1955 |
| GB | 2 063 544 | 6/1981 |
| JP | 41-2063 | 2/1966 |
| JP | 57-63797 | 4/1982 |
| JP | 59-25197 | 2/1984 |
| JP | 63-245889 | 10/1988 |
| JP | 4-51795 | 4/1992 |
| JP | 07-085969 | 3/1995 |
| JP | 7-85969 | 3/1995 |
| JP | 08-55680 | 2/1996 |
| JP | 8-138869 | 5/1996 |
| JP | 8-153582 | 6/1996 |
| JP | 10-233285 | 9/1998 |
| JP | 63-276892 | 11/1998 |
| JP | 11-026166 | 1/1999 |
| JP | 2001-52875 | 2/2001 |
| JP | 2002-050474 | 2/2002 |
| JP | 2003-173880 | 6/2003 |
| JP | 2003-243964 | 8/2003 |
| WO | 00/05703 | 2/2000 |
| WO | WO 00/55743 | 8/2000 |

OTHER PUBLICATIONS

Japanese Abstract No. 10-189244, Published Jul. 21, 1998.

Japanese Abstract No. 2002-50486, Published Feb. 15, 2002 with translation.

Japanese Abs. No. 2001-337633, Pub'd Dec. 7, 2001 with translation.

* cited by examiner

EL LIGHT EMITTING DEVICE WITH WATERPROOF FUNCTION

FIELD OF THE INVENTION

The present invention relates to an EL light emitting device comprising an EL light emitting layer, and particularly to an EL light emitting device in which a user can form any light emitting pattern which is preferable for decoration, signboard, interior, toy or the like by applying various inks or drawing with various writing instruments.

BACKGROUND ART

As a light emitting device comprising an electroluminescence (EL) light emitting layer formed with EL material, for example, an EL light emitting device which has a structure of laminating a substrate sheet, an electrode section, an insulating layer (reflecting layer), an EL light emitting layer, a top coat layer (epoxy type protective layer) in this order has been known (see, for example, JP-Tokukaihei-8-153582A).

In this EL light emitting device, a light emitting pattern according to one's preference can be formed by applying an alternating voltage between a fist electrode and a second electrode, and by forming a film of a transparent electrode with a predetermined shape on the top coat layer.

When water or humidity (water or the like) penetrates to reach the electrode section in the EL light emitting device, electrolysis may be generated at the electrode section or the breaking (damage) of wire due to the oxidation of the electrode may be caused. Also, since the first electrode and the second electrode are directly connected through water or the like, there is a safety hazard.

In this regard, in the EL light emitting device described in the reference document 1, the top coat layer functions as a waterproof layer to some extent. However, the top coat layer is exposed and the thickness of the layer is small, so that a part of the top coat layer is likely to be damaged by friction or the like. In this case, the above problem would be exposed.

To solve this, it is considered to thicken the top coat layer. However, when the top coat layer is thickened, the dielectric constant becomes small, thereby raising another problem to decrease the luminous intensity.

The present invention is accomplished in view of the problems, and an object of the present invention is to provided an EL light emitting device which is excellent in waterproof property, moisture-proof property and safety and can suppress the decrease of the luminous intensity as much as possible.

SUMMARY OF THE INVENTION

To solve the above problems and accomplish the objects, in accordance with a first aspect of the present invention, the electroluminescence light emitting device comprises:

an EL light emitting layer comprising an EL light emitting material element and forming a planar light emitting region;

an electrode section comprising a first electrode and a second electrode which are arranged on one surface side of the EL light emitting layer to be close to each other, and to be electrically separated from each other with a spacing region, and having a predetermined pattern;

an alternating current electric field forming element, to form an alternating current electric field in the EL light emitting layer when an alternating current power supply voltage is applied between the first electrode and the second electrode, to be adhered to the other surface side of the EL light emitting layer and a waterproof layer of a synthetic resin is arranged between the first electrode and the second electrode, on the one hand, and the EL light emitting layer, on the other hand.

In accordance with a second aspect of the present invention, the electroluminescence light emitting device comprises:

an EL light emitting layer comprising an EL light emitting material element and forming a planar light emitting region; and an electrode section comprising a first electrode and a second electrode which are arranged on one surface side of the EL light emitting layer to be close to each other, and to be electrically separated from each other with a spacing region, and having a predetermined pattern, an alternating current electric field forming element, to form an alternating current electric field in the EL light emitting layer when an alternating current power supply voltage is applied between the first electrode and the second electrode, to be adhered to the other surface side of the EL light emitting layer; and a waterproof layer of a synthetic resin arranged between one of the first electrode and the second electrode, and the EL light emitting layer.

In accordance with a third aspect of the present invention, the electroluminescence light emitting device comprises:

an EL light emitting layer comprising an EL light emitting material element;

an electrode section comprising a first electrode and a second electrode which are arranged on one surface side of the EL light emitting layer to be close to each other, and to be electrically separated from each other with a spacing region, and having a predetermined pattern; and a reflecting layer arranged on one surface side of the EL light emitting layer; and an alternating current electric field forming element, to form an alternating current electric field in the EL light emitting layer when an alternating current power supply voltage is applied between the first electrode and the second electrode, to be adhered to the other surface side of the EL light emitting layer, wherein the reflecting layer has a penetration prevention function and is arranged between at least one of the first electrode and the second electrode, and the EL light emitting layer.

In accordance with a fourth aspect of the present invention, the electroluminescence light emitting device comprises:

an EL light emitting layer comprising an EL light emitting material element;

an electrode section comprising a first electrode and a second electrode which are arranged on one surface side of the EL light emitting layer to be close to each other, and to be electrically separated from each other with a spacing region, and having a predetermined pattern;

a substrate sheet arranged on one surface side of the EL light emitting layer; and an alternating current electric field forming element, to form an alternating current electric field in the EL light emitting layer when an alternating current power supply voltage is applied between the first electrode and the second electrode, to be adhered to the other surface side of the EL light emitting layer, wherein the substrate sheet has a penetration prevention function and is arranged between at least one of the first electrode and the second electrode, and the EL light emitting layer.

In accordance with a fifth aspect of the present invention, the electroluminescence light emitting device comprises:

an EL light emitting layer comprising an EL light emitting material element;

an electrode section comprising a first electrode and a second electrode which are arranged on one surface side of the EL light emitting layer to be close to each other, and to be electrically separated from each other with a spacing region, and having a predetermined pattern; and an alternating current electric field forming element to form an alternating current electric field in the EL light emitting layer when an alternating current power supply voltage is applied between the first electrode and the second electrode, to be adhered to the other surface side of the EL light emitting layer, wherein the EL light emitting layer has a penetration prevention function.

As "the AC electric field forming element" in the present invention, a stick type painting material such as a well-known ink, a pencil, a crayon, a pastel and the like, a sheet material having electrical conductivity or dielectric and the like can be used. Among them, as the ink, one having a surface resistance value equal to or less than $10^6$ $\Omega/\square$ in the state of being coated, having optical transparency, and including at least one kind of powder of the electrically conductive materials such as indium oxide, tin oxide, antimony, zinc oxide and the like, in a solvent is preferable. Further, as the ink, an electrically conductive polymer such as polyethylene dioxi thiophene and the like or a mixture of the electrically conductive polymer with the powder of the electrically conductive material may be used. In this case, it is possible to make the ink emit light for a long period until removal of the ink by wiping or the like.

The stick type painting material such as the ink, the pencil, the crayon, the pastel and the like, may include organic or inorganic coloring pigments.

Also, the "AC electric field forming element" may be formed with water or a solvent having a high dielectric constant. In this case, the AC electric field forming element can easily be removed by drying it with a dryer, or by wiping it.

As described above, the "AC electric field forming element" described in the specification may be so-called dielectric or so-called electric conductor. That is, the "AC electric field forming element" described in the specification indicates everything which forms an electric field in the EL light emitting layer when adhered to the other surface side of the EL light emitting layer.

According to the first to fifth aspects of the present invention, when the AC electric field forming element is formed on the other surface side of the EL light emitting layer in a state of applying the AC power supply voltage between the first electrode and the second electrode, or when the AC power supply voltage is applied between the first electrode and the second electrode in a state of forming the AC electric field forming element on the other surface side of the EL light emitting layer, the AC electric field is formed in the EL light emitting layer, thereby emitting light at a part of the EL light emitting layer just under the AC electric field forming element. Thus, a user can easily produce a desired light emitting pattern.

Further, according to the first aspect of the present invention, the waterproof layer of synthetic resin is arranged between the first electrode and the second electrode, and the EL light emitting layer, so that the waterproof layer prevents penetration of water or the like, which results in preventing the adhesion of water or the like to the first electrode and the second electrode. Thus, generation of electrolysis between the first electrode and the second electrode can be prevented, and the breaking (damage) of wire due to the oxidation of the electrodes can be prevented.

Further, according to the second aspect of the present invention, the waterproof layer of synthetic resin is arranged between one of the first electrode and the second electrode, and the EL light emitting layer, so that the waterproof layer prevents penetration of water or the like, which results in preventing the adhesion of water or the like to one of the electrodes. Thus, generation of electrolysis between the first electrode and the second electrode can be prevented, and the breaking (damage) of wire due to the oxidation of one of the electrodes can be prevented.

Further, according to the third and fourth aspects of the present invention, by the synthetic resin part having a penetration prevention function, the same effect as the first and the second aspects of the present invention can be obtained.

Further, according to the fifth aspect of the present invention, since the EL light emitting layer has a penetration prevention function, penetration of water or the like can be prevented, which results in preventing the adhesion of water or the like to the first electrode and the second electrode. Thus, generation of electrolysis between the first electrode and the second electrode can be prevented, and the breaking (damage) of wire due to the oxidation of the electrodes can be prevented.

DESCRIPTION OF THE PREFERRED EMBODIMENTS

I. First Embodiment

1. Whole Configuration

Figure 1:
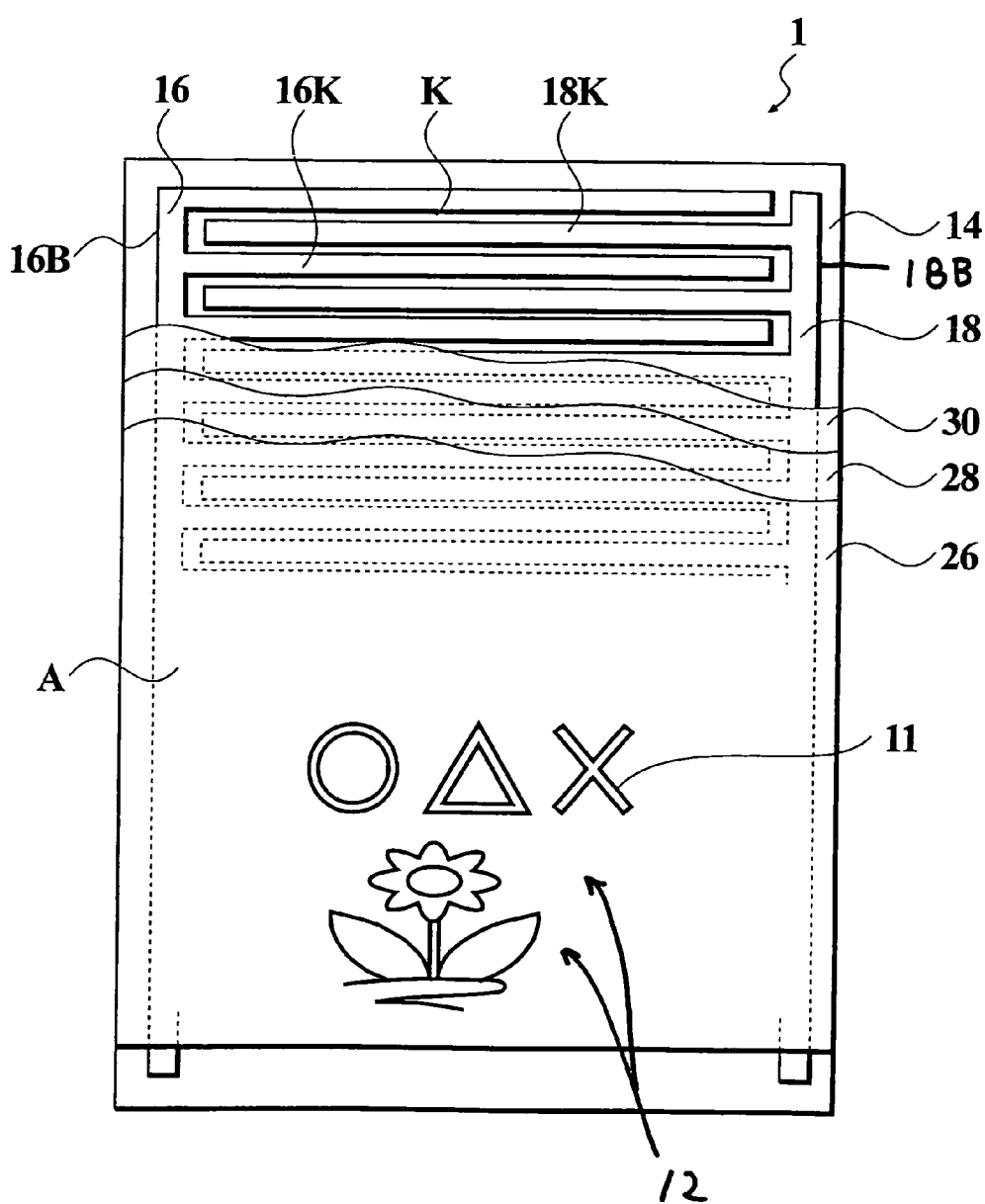
FIG. 1 is a plan view of an EL light emitting device according to the first embodiment of the present invention in which each layer is partially broken away.
Figure 2:
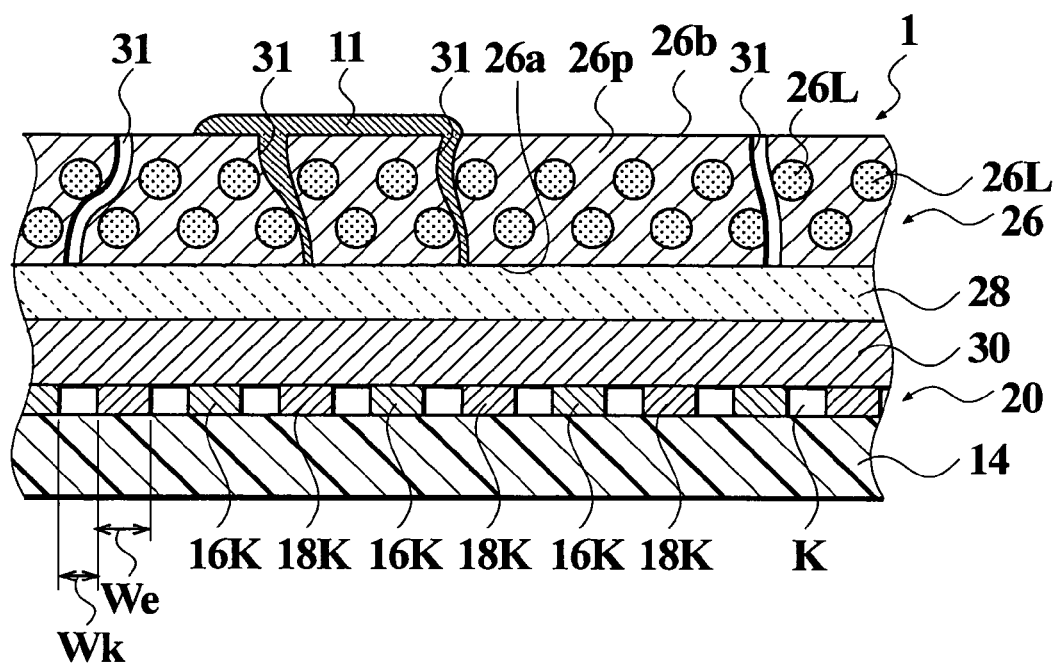
FIG. 2 is an expanded sectional view of a main portion of the EL light emitting device shown in FIG. 1.

FIG. 1 is a plan view of a thin plate shaped EL light emitting device 1 according to the first embodiment of the present invention in which a portion of each layer on the surface side is broken away. FIG. 2 is a sectional view of a main portion of the EL light emitting device 1, that is, an expanded sectional view showing a portion of the EL light emitting device 1 in FIG. 1.

The EL light emitting device 1, as shown in FIG. 1, is formed into a rectangle as a whole, and comprises a rectangular light emitting region A on approximately the whole area of the top surface (surface). The EL light emitting device 1, as shown in FIG. 2, has a structure of laminating a substrate sheet 14, an electrode 20, a waterproof layer 30, a light reflecting layer 28 and an EL (electroluminescence) light emitting layer 26 in this order.

For example, when a user attaches an AC electric field forming element 11 to the surface of the EL light emitting layer 26 by hand, printing or the like, and applies alternating voltage to the electrode section, the EL light emitting device 1 locally emits light with a light emitting pattern 12 corresponding to the attached pattern of the AC electric field forming element 11 in the light emitting region A.

2. Configuration of Each Part (1) Substrate Sheet 14

The substrate sheet 14 is arranged on one surface 26a side to be described later of the EL light emitting layer 26. The substrate sheet 14 is made of synthetic resin or glass which is transparent or opaque. For example, polyethylene terephthalate (PET) or the like is used as the synthetic resin.

(2) Electrode Section 20

The electrode section 20 is arranged on the one surface 26a side of the EL light emitting layer 26. The electrode section 20 comprises a first electrode 16 and a second electrode 18. The first electrode 16 and the second electrode 18 are close to and electrically insulated from each other with a spacing region K. In the figure, the first electrode 16 and the second electrode 18 are formed to have a comb-like pattern shape. The first electrode 16 and the second electrode 18 are formed to make the spacing regions K substantially the same per a unit area in the light emitting region A. The first electrode 16 and the second electrode 18 have flexibility.

The above first electrode 16 and second electrode 18 comprise bus electrodes 16B and 18B which are positioned along one long side and the other long side of the EL light emitting device 1, respectively, and comb electrodes 16K and 18K which project toward each other from the bus electrodes 16B and 18B at regular intervals to alternate with each other.

The end portions of the bus electrodes 16B and 18B which are exposed to the surface to function as a terminal. The gap between the first electrode 16 (comb electrode 16K) and the second electrode 18 (comb electrode 18K), that is, the width Wk of the spacing region K is, for example, about 0.1–2.0 mm, preferably 0.3–1.0 mm. The width We between the first electrode 16 (comb electrode 16K) and the second electrode 18 (comb electrode 18K) is, for example, about 0.1–5.0 mm, preferably 0.3–3.0 mm.

The first electrode 16 and the second electrode 18 are fixed by depositing, for example, a pasty silver paste including silver powder, a pasty copper paste including copper powder, an electrically conductive paste such as carbon or the like on the substrate sheet 14 in a predetermined pattern by the screen printing process, and thereafter by performing a heat drying process. The first electrode 16 and the second electrode 18 may be formed by etching metal foil or the metal deposition film such as copper, aluminum or the like.

(3) Waterproof Layer 30

The waterproof layer 30 is arranged between the first electrode 16 and the second electrode 18, and the light reflecting layer 28.

The waterproof layer 30 is formed with synthetic resin which includes, for example, a fluorocarbon resin such as a 4-fluorinated ethylene resin, fluororubber and the like; a silicon resin such as silicon rubber and the like; the other epoxy resins; an acrylic resin; a urethane resin; a polyester resin; and a resin having a high sealing property such as an ethylene-vinyl acetate copolymer and the like. These resins are cured by a method such as UV curing, IR curing, two-liquid curing, heat curing and the like.

When the AC electric field forming element 11 is liquid, the waterproof layer 30 prevents the AC electric field forming element 11 from penetrating to the electrode section 20, that is, preventing the AC electric field forming element 11 from adhering to both of the first electrode 16 and the second electrode 18.

(4) Light Reflecting Layer 28

The light reflecting layer 28 is arranged between the waterproof layer 30 and the EL light emitting layer 26. The light reflecting layer 28 is fixed in a state of adhering to the one surface 26a of the EL light emitting layer 26.

The light reflecting layer 28 is made by dispersing inorganic powder which is ferroelectric powder such as barium titanate or Rochelle salt, into a resin functioning as a bonding agent such as an acrylic resin or the like. Since the inorganic powder such as the ferroelectric powder is a pigment showing white, the light reflecting layer 28 becomes white, and therefore exhibits the light reflecting function effectively.

The light reflecting layer 28 has a thickness of about 10–30 μm, a withstanding voltage of about 200–300V, and a dielectric constant of about 30–100, preferably about 60–100.

(5) EL Light Emitting Layer 26

The EL light emitting layer 26 is made of organic or inorganic EL light emitting material elements $26_L$ which are, for example, fluorescent material or phosphor particles and a transparent resin binder $26_P$ for fixing the EL light emitting material elements $26_L$ in a state of being dispersed. As the resin binder $26_P$, a resin having a high dielectric constant such as a polyester resin or the like may preferably be selected. The EL light emitting layer 26 has a thickness of about 30–40 μm, a withstanding voltage of about 50–150V, and a dielectric constant of about 10–30. The thickness of the EL light emitting layer 26 is preferably one and a half times as large as the diameter of the EL light emitting material element $26_L$ or more. In this case, the surface of the EL light emitting layer 26 is regarded as being smooth, and for example, the surface roughness is regarded as being 30 μm or less.

The EL light emitting layer 26 configured as above emits light of a predetermined luminescent color such as a bluish green color when an AC power supply voltage is applied between the first electrodes 16 and the second electrodes 18.

(6) AC Electric Field Forming Element 11

The AC electric field forming element 11 is adhered to the other surface 26b side of the EL light emitting layer 26. As the AC electric field forming element 11, a stick type painting material such as a well-known ink, a pencil, a crayon, a pastel and the like, a sheet material having electrical conductivity (hereinafter referred to as a conductor sheet) and the like can be used. The stick type painting material such as the ink, the pencil, the crayon, the pastel and the like, may include an organic or an inorganic coloring pigment.

As the ink, for example, one having a surface resistance value equal to or less than $10^6$ $\Omega/\square$ in the state of being coated, having optical transparency, and including at least one kind of powder of the electrically conductive materials such as indium oxide, tin oxide, antimony, zinc oxide and the like, in a solvent is preferable. Further, as the ink, an electrically conductive polymer such as polyethylene dioxi thiophene and the like or a mixture of the electrically conductive polymer with the powder of the electrically conductive material may be used. In this case, it is possible to make the ink emit light for a long period until removal of the ink by wiping or the like. Moreover, the AC electric field forming element 11 may be formed with water or a solvent having a high dielectric constant. In this case, the AC electric field forming element 11 can easily be removed by drying it with a dryer, or by wiping it.

3. Operation

The AC electric field forming element 11 is adhered to the other surface 26b of the EL light emitting layer 26 in a desired pattern. The adhesion of the AC electric field forming element 11 is performed by drawing with a brush (a pencil, a pastel or a crayon), by performing printing with an ink jet printer or screen printing, or by sticking an electrically conductive sheet. In this state, an AC power supply voltage from an AC power supply 32 is applied to the end portions of the bus electrode 16B or 18B exposed to the surface. Incidentally, the AC electric field forming element 11 may be attached after the AC power supply voltage has previously been applied to the end portions.

Figure 3:
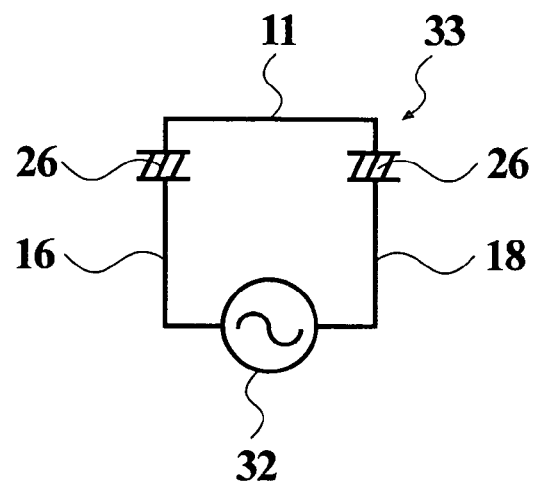
FIG. 3 is view showing an electrically equivalent circuit for explaining the light emitting principle of the EL light emitting device shown in FIG. 1.

Then, by the adhesion of the AC electric field forming element 11, an AC electric field is formed in the EL light emitting layer 26, and only the part just under the AC electric field forming element 11 in the EL light emitting layer 26 emits light locally. That is, since the EL light emitting layer 26 and the light reflecting layer 28 have a high dielectric constant, an equivalent circuit of a closed circuit 33 (AC circuit) shown in FIG. 3 comprising the first electrode 16, the light reflecting layer 28, the EL light emitting layer 26, the AC electric field forming element 11, the EL light emitting layer 26, the light reflecting layer 28, the second electrode 18 and the like is formed to create an AC electric field in the EL light emitting layer 26. Then, the part just under the adhesion part of the AC electric field forming element 11 emits light. On the other hand, the intensity of the AC electric field at the places just under the parts where the AC electric field forming element 11 is not adhered is insufficient for the EL light emitting layer 26 to emit light, so these parts do not emit light. The thickness and the dielectric constant of the EL light emitting layer 26 or the like are set in order that only the part just under the AC electric field forming element 11 may emit light selectively.

In the case that the AC electric field forming element 11 is liquid, when the AC electric field forming element 11 is adhered to the other surface 26b of the EL light emitting layer 26, there is a case where the AC electric field forming element 11 permeates the EL light emitting layer 26 and the light reflecting layer 28 through a scratch, a pinhole 31 which inevitably exists or the like. However, the waterproof layer 30 prevents the further permeation of the AC electric field forming element 11. Moreover, the waterproof layer 30 also prevents the permeation of moisture or humidity in the air.

4. Advantageous Effects

According to the present embodiment, an AC electric field is formed at a part of the EL light emitting layer 26 just under the AC electric field forming element 11, and only the part locally emits light. This indicates that, if the AC electric field forming element 11 is adhered in the same pattern as a desired pattern, a desired light emitting pattern can be obtained. Thus, the EL light emitting device 1 with which a user can easily produce a desired light emitting pattern can be obtained.

Further, according to the present embodiment, the waterproof layer 30 prevents penetration of water or the like, so that generation of electrolysis between the first electrode 16 and the second electrode 18 can be prevented. Also, the breaking (damage) of wire due to the oxidation of the first electrode 16 and the second electrode 18 can be prevented.

Further, in the present embodiment, since the electrode section 20 is arranged such that the spacing regions K between the first electrode 16 and the second electrode 18 are the same per a unit area in the light emitting region A, there is no unevenness in light emission of the EL light emitting layer 26 positioned just under the AC electric field forming element 11 in any place in the planar light emitting region A, thereby equalizing the luminous intensity.

The widths of the spacing regions Wk between the first electrode 16 and the second electrode 18 are, for example, about 0.1–2.0 mm, preferably 0.3–1.0 mm. The widths We of the first electrode 16 (comb electrode 16K) and the second electrode 18 (comb electrode 18K) are, for example, about 0.1–5.0 mm, preferably 0.3–3.0 mm, so that there is no unevenness in light emission of the EL light emitting layer 26 positioned just under the AC electric field forming element 11, thereby equalizing the luminous intensity.

Further, in the present embodiment, the thickness of the EL light emitting layer 26 is about 20–50 μm, so that a high luminous intensity can be obtained.

Incidentally, when the thickness is less than 20 μm, the strength of the electric field applied to the EL light emitting material elements $26_L$ becomes high, however, the EL light emitting material elements $26_L$ contributing to light emission decrease. When the thickness is more than 50 μm, the EL light emitting material elements $26_L$ contributing to light emission increase, however, the strength of the electric field applied to the EL light emitting material elements $26_L$ becomes low. Therefore, the luminous intensity is decreased in both cases.

Further, in the present embodiment, since the light reflecting layer 28 for reflecting light from the EL light emitting layer 26 is provided between the EL light emitting layer 26 and the electrode section 20, light from the EL light emitting layer 26 is reflected to the EL light emitting layer 26 side by the light reflecting layer 28. Thus, efficiency of light emission rises, enabling higher luminous intensity.

Further, in the present embodiment, since the light reflecting layer 28 for reflecting light from the EL light emitting layer 26 is provided between the EL light emitting layer 26 and the electrode section 20, light from the EL light emitting layer 26 is reflected to the EL light emitting layer 26 side by the light reflecting layer 28. Thus, efficiency of light emission rises, enabling higher luminous intensity.

Further, in the present embodiment, since the light reflecting layer 28 is made by bonding ferroelectric powder with a resin bonding agent, the ferroelectric powder shows whitish to contribute to light reflection, thus a higher luminous intensity can be obtained, and at the same time, since ferroelectric powder has a high dielectric constant, the dielectric constant of the light reflecting layer 28 becomes high, which results in suppressing the decrease of the strength of the electric field applied to the EL light emitting material elements 26L even when the light reflecting layer 28 is provided between the EL light emitting layer 26 and the electrode section 20.

Further, in the present embodiment, since the light reflecting layer 28 has a dielectric constant of about 30–100, preferably about 60–100, that is, the light reflecting layer 28 has a dielectric constant of not less than 30, preferably not less than 60, the decrease of the strength of the electric field applied to the EL light emitting material elements 26L is suppressed even when the light reflecting layer 28 is provided between the EL light emitting layer 26 and the electrode section 20.

Further, in the present embodiment, since the AC electric field forming element 11 has a surface resistance value not more than $10^6$ $\Omega/\square$ in a state of being formed and optical transparency, the AC electric field forming element 11 can form a part of the closed circuit 33 between the first electrode 16 and the second electrode 18, enabling the EL light emitting layer 26 to locally emit light.

Figure 4:
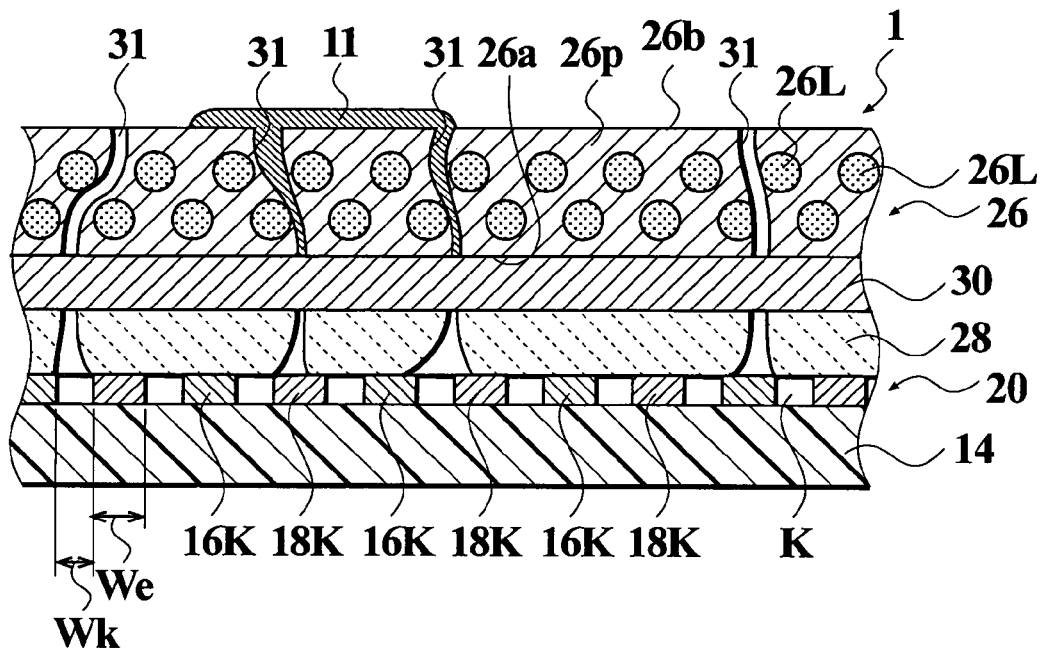
FIG. 4 is an expanded sectional view showing a main portion of a modified example of the EL light emitting device shown in FIG. 2.

In the first embodiment, the waterproof layer 30 is arranged between the electrode section 20 and the light reflecting layer 28, however, as shown in FIG. 4, the light reflecting layer 28 may be arranged between the electrode section 20 and the waterproof layer 30. In the figure, any component that is the same as in the first embodiment will be given the same reference numeral and the explanations thereof will be omitted.

In this case also, the waterproof layer 30 prevents penetration of the AC electric field forming element 11, water or the like, so that adhesion of the AC electric field forming element 11, water or the like to both of the first electrode 16 and the second electrode 18 can be prevented. Consequently, generation of electrolysis between the first electrode 16 and the second electrode 18 can be prevented. Also, the breaking (damage) of wire due to the oxidation of the first electrode 16 and the second electrode 18 can be prevented.

6. Modified Example (2) of the First Embodiment

Figure 5:
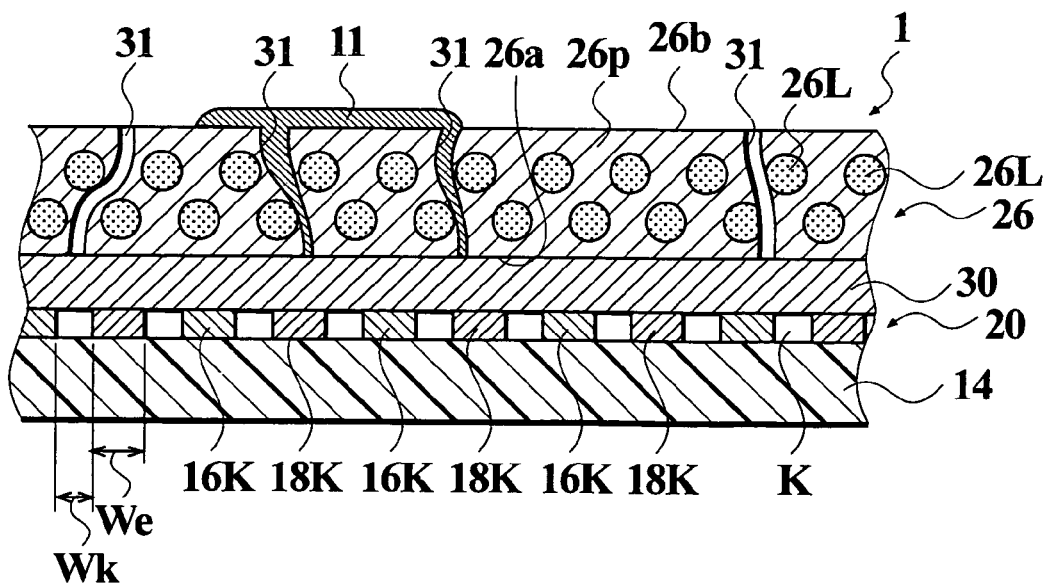
FIG. 5 is an expanded sectional view showing a main portion of another modified example of the EL light emitting device shown in FIG. 2.

As shown in FIG. 5, the structure may be such that the light reflecting layer 28 is not provided. In the figure, the waterproof layer 30 is arranged between the electrode section 20 and the EL light emitting layer 26. Any component that is the same as in the above described embodiments will be given the same reference numeral and the explanations thereof will be omitted.

In this case also, the waterproof layer 30 prevents penetration of the AC electric field forming element 11, water or the like, so that adhesion of the AC electric field forming element 11, water or the like to both of the first electrode 16 and the second electrode 18 can be prevented. Consequently, generation of electrolysis between the first electrode 16 and the second electrode 18 can be prevented. Also, the breaking (damage) of wire due to the oxidation of the first electrode 16 and the second electrode 18 can be prevented.

II. Second Embodiment

1. Whole Configuration

Figure 6:
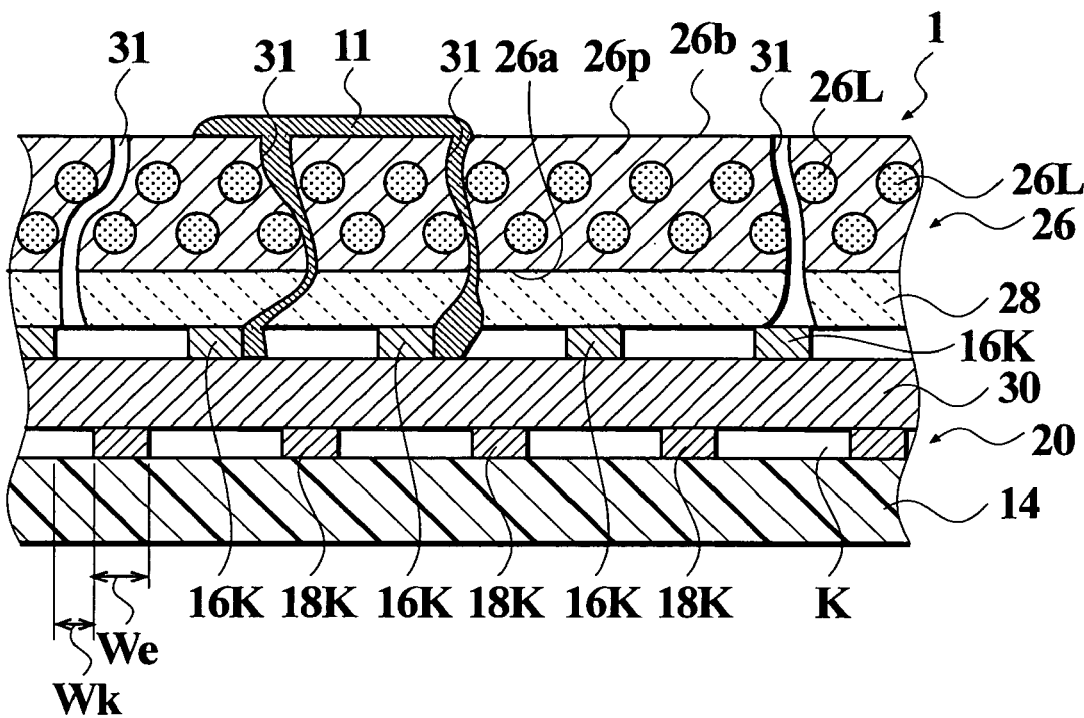
FIG. 6 is an expanded sectional view showing a main portion of the EL light emitting device according to the second embodiment of the present invention.

The EL light emitting device 1 according to the second embodiment will be explained referring to FIG. 6. Any component that is the same as in the first embodiment will be given the same reference numeral and the explanations thereof will be omitted.

In the EL light emitting device 1 in the present embodiment, only the second electrode 18 is formed on the substrate sheet 14, and the first electrode 16 is arranged between the waterproof layer 30 and the light reflecting layer 28. The waterproof layer 30 is arranged between the first electrode 16 and the second electrode 18.

That is, in the present embodiment, the structure is such that the substrate sheet 14, the second electrode 18, the waterproof layer 30, the first electrode 16, the light reflecting layer 28 and the EL light emitting layer 26 are laminated in this order.

2. Operation

The waterproof layer 30 in the present embodiment prevents penetration of the AC electric field forming element 11, water or the like, so that adhesion of the AC electric field forming element 11, water or the like to the second electrode 18 can be prevented.

3. Advantageous Effects

An AC electric field is formed at a part of the EL light emitting layer 26 just under the AC electric field forming element 11, and only the part locally emits light. This indicates that, if the AC electric field forming element 11 is adhered in the same pattern as a desired pattern, a desired light emitting pattern can be obtained. Thus, the EL light emitting device 1 with which a user can easily produce a desired light emitting pattern can be obtained.

Further, according to the present embodiment, since penetration of water or the like is prevented by the waterproof layer 30, generation of electrolysis between the first electrode 16 and the second electrode 18 can be prevented. Also, the breaking (damage) of wire due to the oxidation of the second electrode 18 can be prevented.

4. Modified Example (1) of the Second Embodiment

Figure 7:
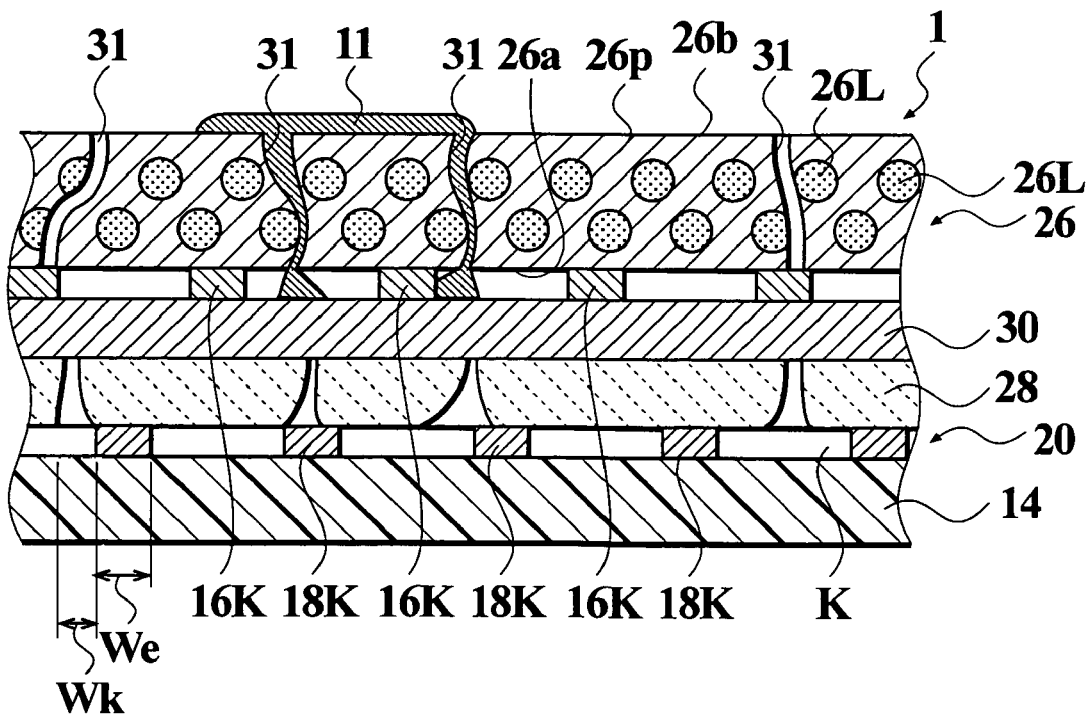
FIG. 7 is an expanded sectional view showing a main portion of a modified example of the EL light emitting device shown in FIG. 6.

In the present embodiment, the substrate sheet 14, the second electrode 18, the waterproof layer 30, the first electrode 16, the light reflecting layer 28 and the EL light emitting layer 26 are laminated in this order, however, as shown in FIG. 7, the structure may be such that the substrate sheet 14, the second electrode 18, the light reflecting layer 28, the waterproof layer 30, the first electrode 16 and the EL light emitting layer 26 are laminated in this order. Any component that is the same as in the above embodiments will be given the same reference numeral and the explanations thereof will be omitted.

In this case also, the waterproof layer 30 prevents penetration of the AC electric field forming element 11, water or the like, so that adhesion of the AC electric field forming element 11, water or the like to the second electrode 18 can be prevented. Consequently, generation of electrolysis between the first electrode 16 and the second electrode 18 can be prevented. Also, the breaking (damage) of wire due to the oxidation of the second electrode 18 can be prevented.

5. Modified Example (2) of the Second Embodiment

Figure 8:
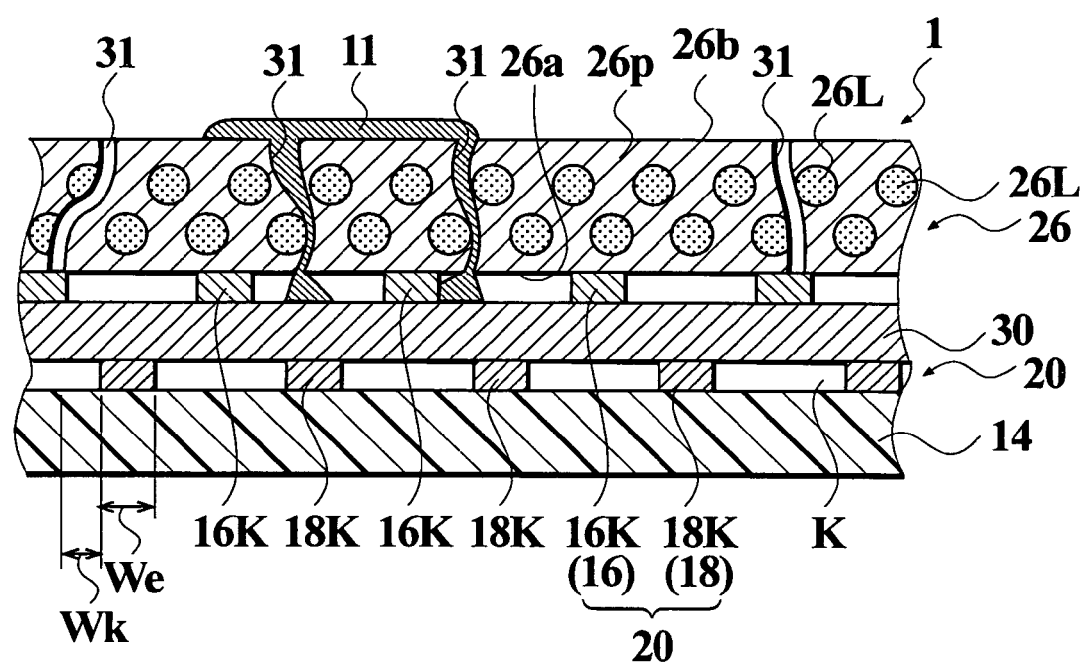
FIG. 8 is an expanded sectional view showing a main portion of another modified example of the EL light emitting device shown in FIG. 6.

As shown in FIG. 8, the structure may be such that the light reflecting layer 28 is not provided. In the figure, the waterproof layer 30 is arranged between the first electrode 16 and the second electrode 18. Any component that is the same as in the above described embodiments will be given the same reference numeral and the explanations thereof will be omitted.

In this case also, the waterproof layer 30 prevents penetration of the AC electric field forming element 11, water or the like, so that adhesion of the AC electric field forming element 11, water or the like to the second electrode 18 can be prevented. Consequently, generation of electrolysis between the first electrode 16 and the second electrode 18 can be prevented. Also, the breaking (damage) of wire due to the oxidation of the second electrode 18 can be prevented.

III. Third Embodiment

1. Whole Configuration

Figure 9:
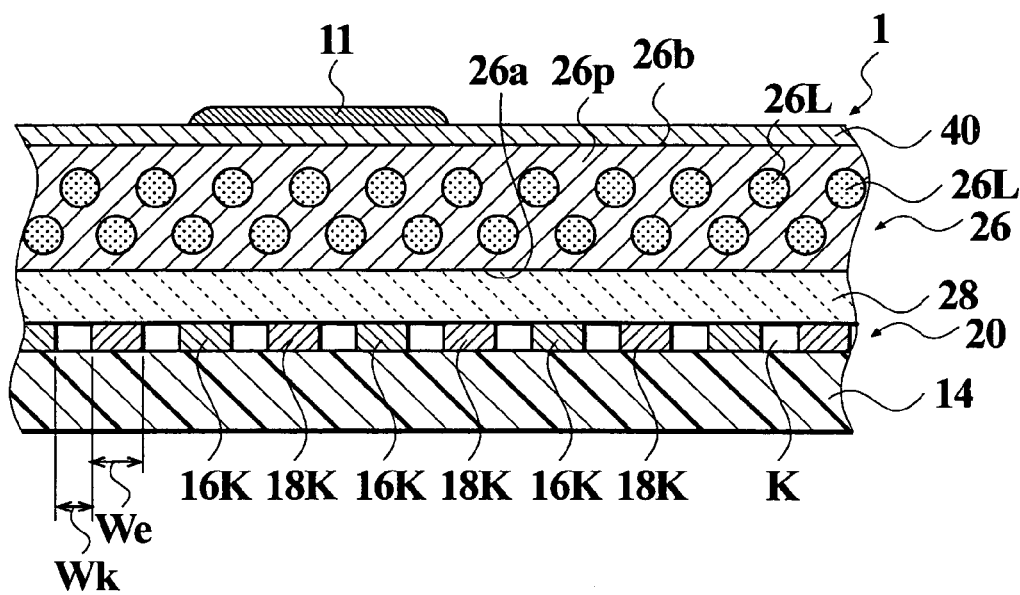
FIG. 9 is an expanded sectional view showing a main portion of an EL light emitting device according to the third embodiment of the present invention.

In the present embodiment, as shown in FIG. 9, the EL light emitting layer 26 comprises a penetration prevention function to water, humidity or the like. That is, the EL light emitting layer 26 is made of the organic or inorganic EL light emitting material elements $26_L$ which are, for example, fluorescent material or phosphor and the transparent resin binder $26_P$ for fixing the EL light emitting material elements $26_L$ in a state of being dispersed, and a synthetic resin having a waterproof property and a moisture-proof property is used as the resin binder $26_P$. For example, a fluorocarbon resin such as a 4-fluorinated ethylene resin, fluororubber and the like; a silicon resin such as silicon rubber and the like; the other epoxy resins; an acrylic resin; a urethane resin; a polyester resin; or a resin having a high sealing property such as an ethylene-vinyl acetate copolymer and the like is used. These resins are cured by a method such as the UV curing, the IR curing, the two-liquid curing, the heat curing and the like.

Further, in the present embodiment, the top coat layer 40 is provided on the EL light emitting layer 26. The main object of providing the top coat layer 40 is to smooth the surface of the EL light emitting layer 26. Accordingly, if the surface of the EL light emitting layer 26 itself is smooth, the top coat layer 40 is not necessarily required.

As the top coat layer 40, for example, a fluorocarbon resin such as a 4-fluorinated ethylene resin, fluororubber and the like; a silicon resin such as silicon rubber and the like; a polyester resin and the like; or a urethane resin is used. The main object of providing the top coat layer 40, as described above, is to smooth the surface of the EL light emitting layer 26 so that the AC electric field forming element 11 drawn by a brush can easily be removed. Thus, the thickness of the top coat layer 40 to be formed is enough to be a degree which makes it possible to attain the object. On the other hand, it is preferable that the top coat layer 40 is as thin as possible, because the greater the thickness, the more the luminous intensity decreases.

The thickness is practically preferable to be about 1 µm–2 µm as the effective value. Hereupon, the "effective value" means the thickness of the top coat layer 40 placed on the uppermost part of the EL light emitting layer 26. It is sufficient to make the coating value of the thickness to be about 5–8 µm for obtaining the thickness of about 1 µm–2 µm as the effective value. Hereupon, the "coating value" means the thickness when the coating is performed on a surface having no irregularities.

2. Advantageous Effects

Since the EL light emitting layer 26 prevents penetration of water or the like, generation of electrolysis between the first electrode 16 and the second electrode 18 can be prevented. Also, the breaking (damage) of wire due to the oxidation of the first electrode 16 and the second electrode 18 can be prevented.

IV. Fourth Embodiment

1. Whole Configuration

Figure 10:
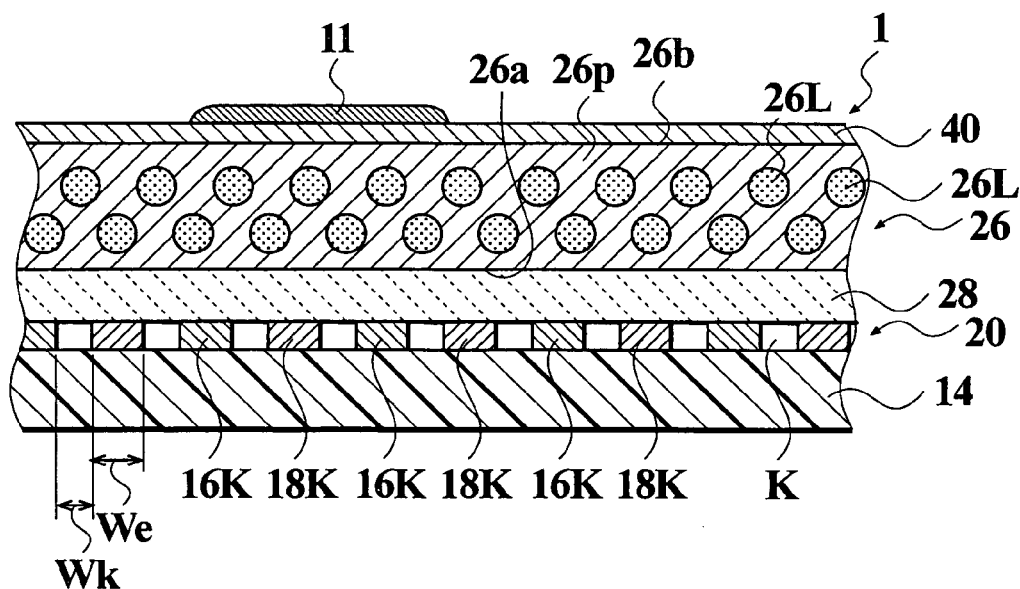
FIG. 10 is an expanded sectional view showing a main portion of an EL light emitting device according to the fourth embodiment of the present invention.

In the present embodiment, as shown in FIG. 10, the light reflecting layer 28 comprises a penetration prevention function to water, humidity or the like. That is, a synthetic resin having a waterproof property and a moisture-proof property is used as the resin forming the light reflecting layer 28. For example, a fluorocarbon resin such as a 4-fluorinated ethylene resin, fluororubber and the like; a silicon resin such as silicon rubber and the like; the other epoxy resins; an acrylic resin; a urethane resin; a polyester resin; or a resin having a high sealing property such as an ethylene-vinyl acetate copolymer and the like is used. These resins are cured by a method such as the UV curing, the IR curing, the two-liquid curing, the heat curing and the like.

2. Advantageous Effects

Since the light reflecting layer 28 prevents penetration of water or the like, generation of electrolysis between the first electrode 16 and the second electrode 18 can be prevented. Also, the breaking (damage) of wire due to the oxidation of the first electrode 16 and the second electrode 18 can be prevented.

3. Modification of the Fourth Embodiment

In the fourth embodiment, the light reflecting layer 28 having a penetration prevention function is provided between the first electrode 16 and the second electrode 18, on the one hand, and the EL light emitting layer 26, on the other hand, however, the first electrode 16 and the second electrode 18 may be provided with the light reflecting layer 28 having a penetration prevention function located between them.

V. Fifth Embodiment

1. Whole Configuration

Figure 11:
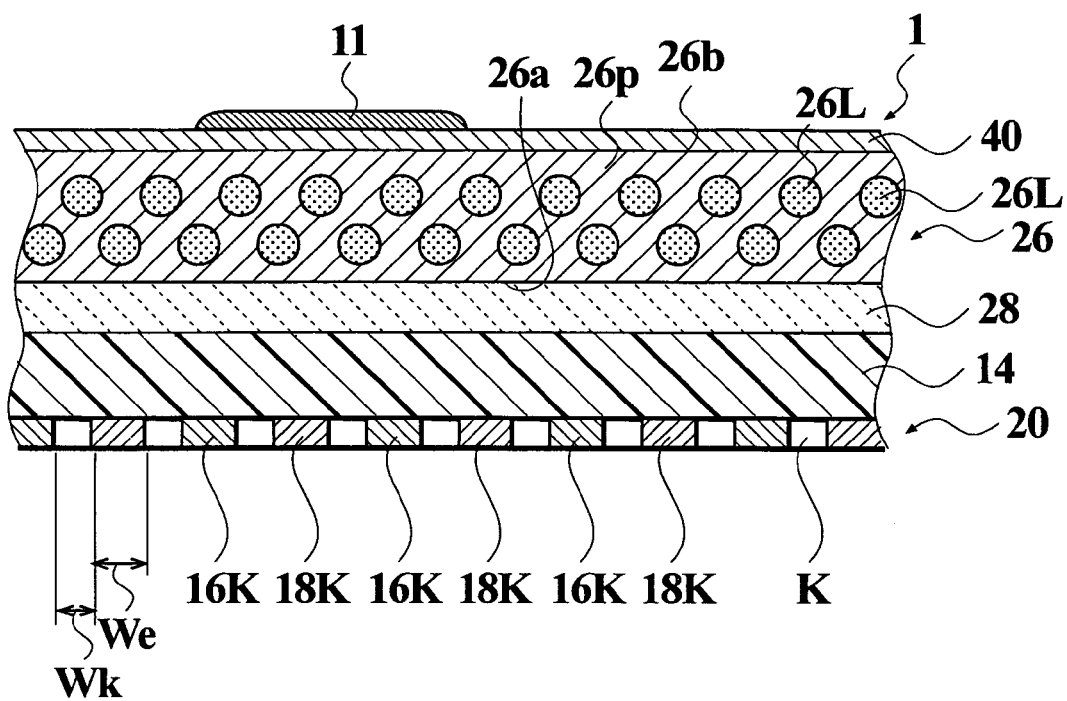
FIG. 11 is an expanded sectional view showing a main portion of an EL light emitting device according to the fifth embodiment of the present invention.
Figure 12:
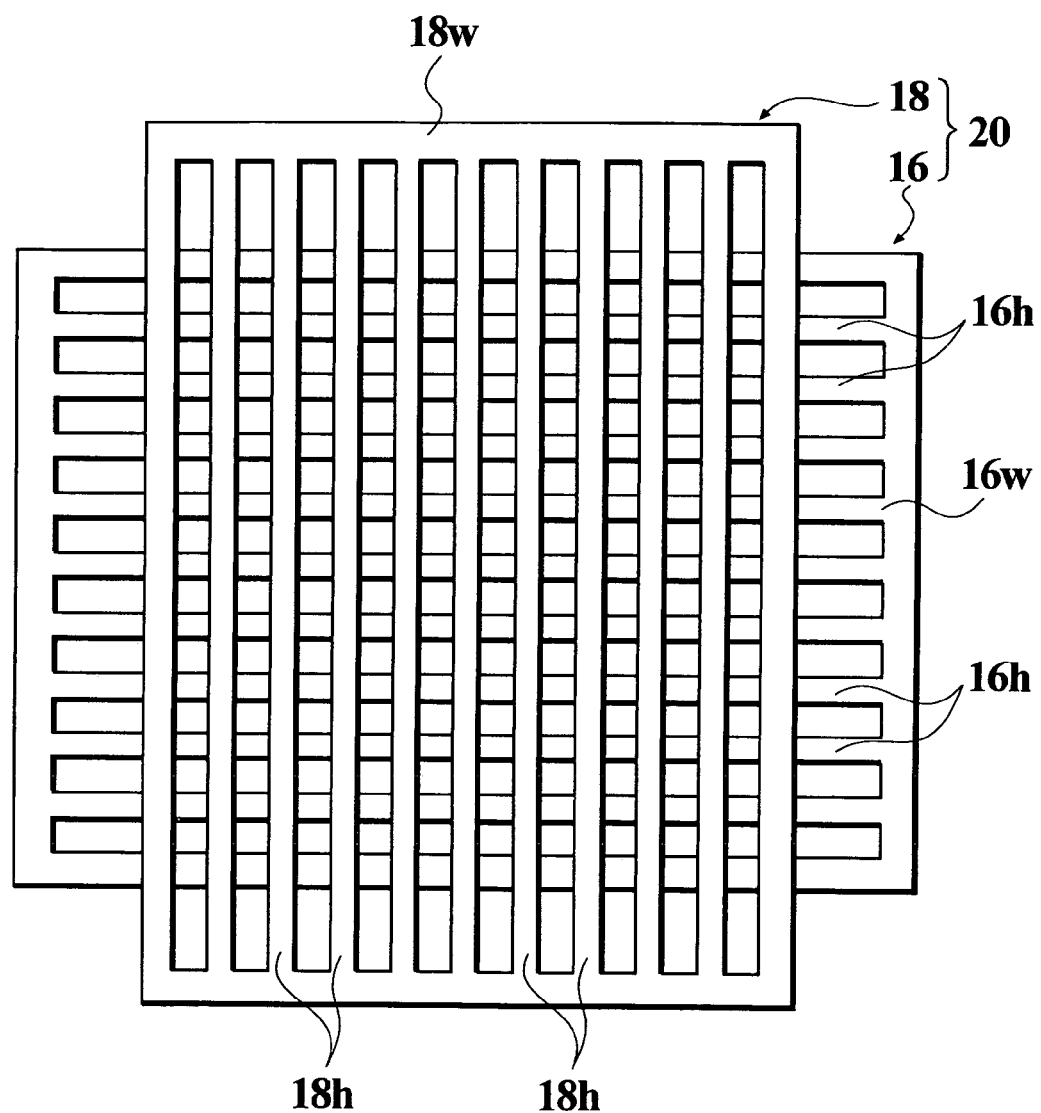
FIG. 12 is an explanation view of a modified example of a first electrode and a second electrode of the EL light emitting device of the present invention.

In the present embodiment, as shown in FIG. 11, the first electrode 16 and the second electrode 18 are provided on the rear surface of the substrate sheet 14 having a penetration prevention function. That is, as the substrate sheet 14, for example, one comprising polyethylene terephthalate is used.

2. Advantageous Effects

Since the substrate sheet 14 prevents penetration of water or the like from the surface side, generation of electrolysis between the first electrode 16 and the second electrode 18 can be prevented. Also, the breaking (damage) of wire due to the oxidation of the first electrode 16 and the second electrode 18 can be prevented.

This structure is used when the EL light emitting device 1 is incorporated in a case body or the like. When the EL light emitting device 1 is incorporated in the case body as above, the rear surface side is generally sealed from exposure, so that the adhesion of water or the like from the rear surface side is needless to consider. If necessary, the exposing electrodes may be coated with a resin having the permeation prevention function, or may be subjected to the alumite processing.

3. Modification of the Fifth Embodiment

Although the first electrode 16 and the second electrode 18 are provided on the rear surface of the substrate sheet 14 in the fifth embodiment, the first electrode 16 and the second electrode 18 may be provided with the substrate sheet 14 between them.

VI. Scope of the Present Invention (1) In the above described embodiments, the first electrode 16 and the second electrode 18 are formed to have a comb-like pattern shape. However, in the present invention, the first electrode 16 and the second electrode 18 may be formed to have various shapes.

For example, as shown in FIG. 11, the first electrode 16 and the second electrode 18 may comprise rectangular frame portions 16w and 18w, and a plurality of parallel portions 16h and 18h arranged within the frame portions 16w and 18w to be formed to have a drain board like shape. The parallel portions 16h and 18h are parallel to one another, and are arranged at regular intervals.

The first electrode 16 and the second electrode 18 with such structure are preferably overlapped in a state that the parallel portions 16h and 18h are at right angles to one another as shown in the figure. Of course, the first electrode 16 and the second electrode 18 are electrically insulated from one another. Although it is not shown in the figure, in the present invention, it is needless to say that each of the first electrode 16 and the second electrode 18 may be formed to have a lattice shape.

(2) In the EL light emitting device 1 of the embodiments, although the light reflecting layer 28 is provided between the electrode 20 and the EL light emitting layer 26, this is for raising the light emitting efficiency by the light reflection, thus, it is not necessarily required.

(3) The first electrode 16 and the second electrode 18 of the above described embodiments are formed by depositing an electrically conductive paste, however, they may be formed by coupling carbon particles with resin or may be formed with a metal deposition film such as an ITO film. When the first electrode 16 and the second electrode 18 are formed with a transparent electrically conductive layer such as an ITO film, double-sided light emission can be realized by forming the substrate sheet 14 with transparent resin.

(4) Further, in the EL light emitting device 1 of the above described embodiments, a protection sheet or the like may be provided outside for electrically or mechanically protecting the EL light emitting device 1.

(5) Further, in the above described embodiments, the EL light emitting device 1 has a rectangular plate shape and edges thereof are linear, however, the EL light emitting device 1 may have a circular shape or an ellipse shape, and edges thereof may be curved.

(6) Further, in the EL light emitting device 1 of the above described first and second embodiments, the structure is such that the light emitting layer 26 is exposed, however, the top coat layer 40 that is same as in the third embodiment may be provided on the light emitting layer 26.

(7) The EL light emitting device 1 of the present invention may be used, for example, for decoration, signboard, interior, toy or the like.

(8) Further, the waterproof layer may be specially provided, or aluminum may be used for the electrodes, which is subjected to alumite processing, instead of forming the EL light emitting layer and the reflecting layer with synthetic resin having penetration prevention function. Accordingly, generation of electrolysis between the first electrode 16 and the second electrode 18 can be prevented. Also, the breaking (damage) of wire due to the oxidation of the electrode can be prevented.

INDUSTRIAL APPLICABILITY

As is clear from the above description, the EL light emitting device of the present invention can be utilized as various light emitting devices inside or outside such as for decoration, signboard, interior, toy or the like.

The invention claimed is:

1. An EL light emitting device comprising:
an EL light emitting layer comprising an EL light emitting material element;
an electrode section comprising a first electrode and a second electrode which are arranged on one surface side of the EL light emitting layer close to each other, and electrically separated from each other with a spacing region, and having a predetermined pattern;
an alternating current electric field forming elements to form an alternating current electric field in the EL light emitting layer when an alternating current power supply voltage is applied between the first electrode and the second electrode, to be adhered to the other surface side of the EL light emitting layer; and
a waterproof layer of a synthetic resin arranged between the first electrode and the second electrode.

2. An EL light emitting device comprising:
an EL light emitting layer comprising an EL light emitting material element;
an electrode section comprising a first electrode and a second electrode which are arranged on one surface side of the EL light emitting layer to be close to each other, and electrically separated from each other with a spacing region, and having a predetermined pattern;
a reflecting layer arranged on said one surface side of the EL light emitting layer;
an alternating current electric field forming elements to form an alternating current electric field in the EL light emitting layer when an alternating current power supply voltage is applied between the first electrode and the second electrode, to be adhered to the other surface side of the EL light emitting layer,
wherein the reflecting layer has a waterproof function and is arranged between at least one of the first electrode and the second electrode, and the EL light emitting layer.

3. The EL light emitting device of claim 1, wherein the EL light emitting layer has a waterproof function.

4. The EL light emitting device of claim 2 wherein the EL light emitting layer has a waterproof function.

* * * * *